(12) United States Patent
Yuan et al.

(10) Patent No.: US 8,491,730 B2
(45) Date of Patent: Jul. 23, 2013

(54) MAGNETIC MATERIAL (75) Inventors: Fu-Te Yuan, Taipei (TW); An-Cheng Sun, Taipei (TW); Jen-Hwa Hsu, Taipei (TW); Chih-Shan Tan, Taipei (TW); Po-Cheng Kuo, Taipei (TW)

(73) Assignee: National Taiwan University, Taipei (TW)

( * ) Notice: Subject to any disclaimer, the term of this patent is extended or adjusted under 35 U.S.C. 154(b) by 20 days.

(21) Appl. No.: 13/160,976

(22) Filed: Jun. 15, 2011

(65) Prior Publication Data
US 2012/0237392 A1 Sep. 20, 2012

(30) Foreign Application Priority Data

Mar. 18, 2011 (TW) .............................. 100109346 A (51) Int. Cl.
*H01F 1/01* (2006.01)
*C22C 5/04* (2006.01)
(52) U.S. Cl.
USPC ......................................... 148/300; 420/466
(58) Field of Classification Search
USPC .................................. 148/300, 315; 420/466
See application file for complete search history.

(56) References Cited

U.S. PATENT DOCUMENTS

| 6,623,875 | B2* | 9/2003 | Inomata et al. | 428/828 |
| 7,229,588 | B2* | 6/2007 | Sandlin et al. | 419/32 |
| 7,580,227 | B2* | 8/2009 | Sato et al. | 360/313 |
| 2004/0074336 | A1* | 4/2004 | Daimon et al. | 75/365 |
| 2005/0051241 | A1* | 3/2005 | Tohji | 148/306 |
| 2009/0050240 | A1* | 2/2009 | Tohji | 148/306 |
| 2010/0246062 | A1* | 9/2010 | Albrecht et al. | 360/131 |
| 2012/0063033 | A1* | 3/2012 | Gurney et al. | 360/234.3 |

OTHER PUBLICATIONS

Ji Hyun Min et al., "Effects of Cu Doping on the Microstructure and the Magnetic Properties of CoPt Nanowires" Journal of Applied Physics, 101, 09K513-1, (2007).*

* cited by examiner

*Primary Examiner* — Roy King
*Assistant Examiner* — Timothy Haug
(74) *Attorney, Agent, or Firm* — Occhiuti Rohlicek & Tsao LLP (57) ABSTRACT A magnetic material includes a main alloy having a rhombohedral crystal structure and a composition represented by $Co_yCu_xPt_z$, wherein x ranges from 3 to 32, y ranges from 18 to 47, and z ranges from 40 to 60, with the proviso that x+y+z=100. The rhombohedral crystal structure of the main alloy includes a magnetic Co—Pt alloy region and a nonmagnetic Cu—Pt alloy region.

6 Claims, 8 Drawing Sheets

MAGNETIC MATERIAL

CROSS-REFERENCE TO RELATED APPLICATION

This application claims priority of Taiwanese application No. 100109346, filed on Mar. 18, 2011.

BACKGROUND OF THE INVENTION

1. Field of the Invention

This invention relates to a magnetic material, more particularly to a magnetic material that has a nanometer-scale pinning effect.

2. Description of the Related Art

A magnet ic material that is applied to a perpendicular magnetic recording medium, a patterned medium, a spintronic device, etc., preferably has an ordered crystal structure and superior perpendicular magnetocrystalline anisotropy ($K_u$).

The applicants of this invention published an article concerning the entire evolution of the structure and magnetic properties of a sputter-deposited CoPt thin film on a MgO (111) substrate (*Scripta Materialia*, 61 (2009), 713-716). The CoPt thin film was deposited on the MgO (111) substrate using dc magnetron sputtering, followed by annealing the CoPt thin film from room temperature (RT) to 750° C. so as to examine the phase transformation of the CoPt thin film within the temperature range. Analyzed by X-ray diffractometry (XRD), the CoPt thin film had a crystal structure of disordered A1 phase when the annealing temperature ($T_s$) is greater than 25° C. and less than 250° C. When 250° C.<$T_s$<350° C., the crystal structure was transformed into $L1_1$ phase that has rhombohedral lattices (lattice parameter: a=b=c and α=β=γ≠90°. When 350° C.<$T_s$<600° C., the crystal structure was replaced by disordered A1 phase. As $T_s$ became higher than 600° C., the crystal structure was transformed into $L1_0$ phase of face-centered tetragonal (fct) AuCu-type structure (lattice parameter: a=b≠c and α=β=γ=90°.

Figure 1:
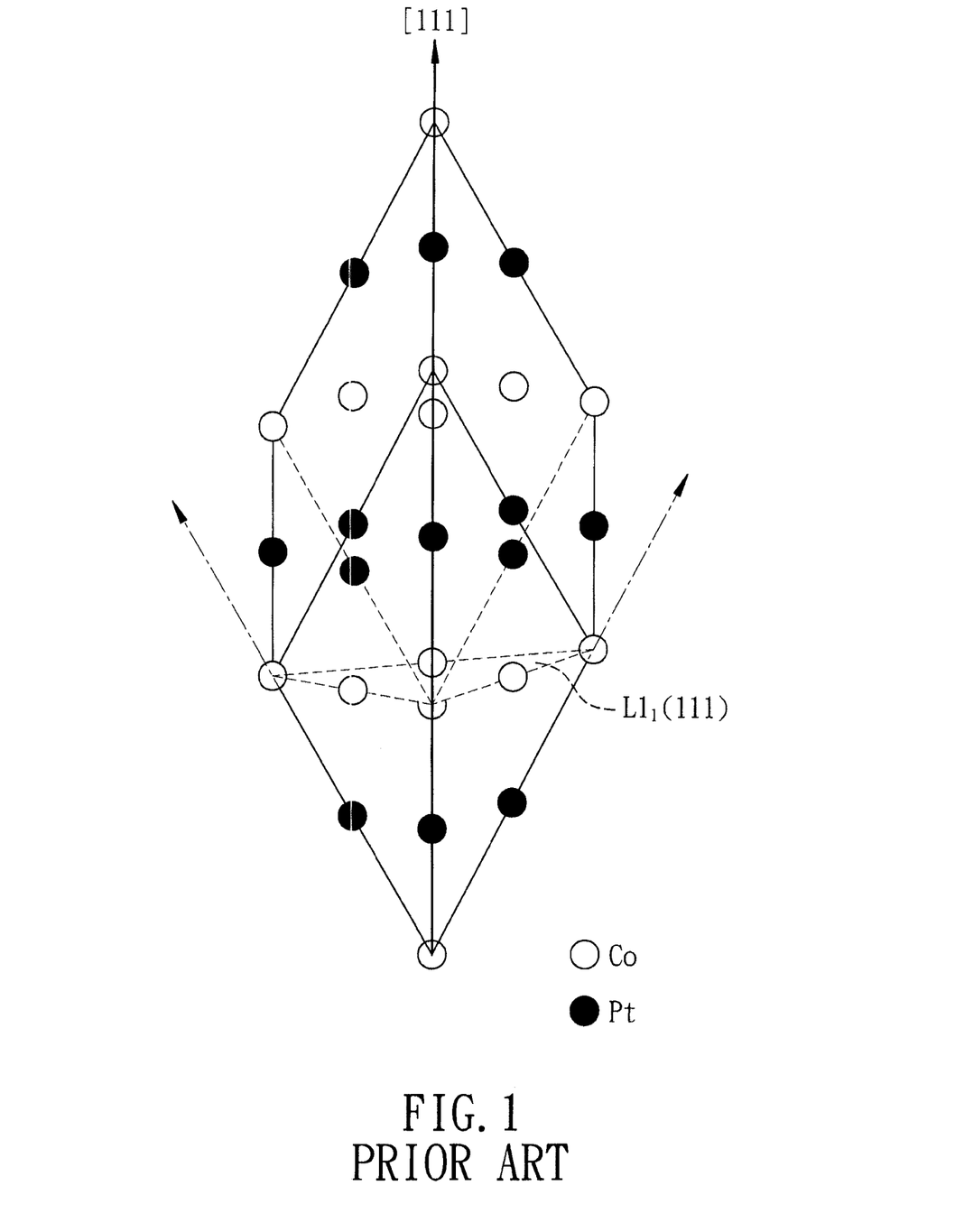
FIG. 1 is a schematic view showing a unit cell of a rhombohedral lattice of a $L1_1$ phase of a CoPt thin film.

Referring to FIG. 1, the rhombohedral lattice of the $L1_1$ phase of the CoPt thin film in the temperature range of 250° C.-350° C. has a unit cell consisting of alternating close-packed atomic layers of Co and Pt along the [111] direction, thereby resulting in a magnetic easy-axis parallel to the [111] direction. The $L1_1$ phase has a relatively low out-of-plane coercivity (Hc⊥) of 39.8 kA/m, i.e., about 0.5 kOe, which is deficient for a patterned medium that generally requires an out-of-plane coercivity of 0.8-5 kOe and a saturation magnetization ($M_s$) of 400-900 emu/cm³.

Ji Hyun Min et al. disclosed Cu-doped CoPt nanowires having a composition of $Co_{58}Cu_{16}Pt_{23}$ and a face centered cubic (fcc)-$Co_3Pt$ phase (lattice parameter: a=b=c and α=β=γ=90° prior to annealing analyzed by energy dispersive spectroscopy (EDS) (see *Journal of Applied Physics*, 101, 09K513, 2007). After annealing at 500° C., minor hexagonal close-packed (hcp)-CoPt phase (lattice parameter: α=β≠c and α=β=90°≠γ) appeared in the Cu-doped CoPt nanowires, with the fcc-$Co_3Pt$ phase retained therein. According to the analysis of hysteresis loops, the Cu-doped CoPt nanowires had an out-of-plane coercivity (Hc⊥) of about 850 Oe, which may conform to the requirements of a patterned medium and a spintronic device (Hc⊥<2 kOe). However, the XRD analysis showed that the annealed Cu-doped CoPt nanowires in this article had no preferred orientation parallel to the nanowire axis (the easy axis), thereby resulting in the inapplicability of the Cu-doped CoPt nanowires in a spintronic device.

Therefore, it is desired in the art to provide a CoPt alloy that has a superior out-of-plane coercivity (Hc⊥) and a preferred orientation parallel to the easy axis of the alloy such that the CoPt alloy may be applied to a patterned medium and a spintronic device.

SUMMARY OF THE INVENTION

The object of the present invention is to provide a magnetic material that has a nanometer-scale pinning effect and that can overcome the aforesaid drawbacks associated with the prior art.

According to the present invention, a magnetic material comprises a main alloy having a rhombohedral crystal structure and a composition represented by $Co_yCu_xPt_z$, wherein x ranges from 3 to 32, y ranges from 18 to 47, and z ranges from 40 to 60, with the proviso that x+y+z=100. The rhombohedral crystal structure of the main alloy includes a magnetic Co—Pt alloy region and a nonmagnetic Cu—Pt alloy region.

BRIEF DESCRIPTION OF THE DRAWINGS

Other features and advantages of the present invention will become apparent in the following detailed description of the preferred embodiments of the invention, with reference to the accompanying drawings, in which.

DETAILED DESCRIPTION OF THE PREFERRED EMBODIMENTS

According to the preferred embodiment of the present invention, a magnetic material comprises a main alloy having a rhombohedral crystal structure and a composition represented by $Co_yCu_xPt_z$, wherein x ranges from 3 to 32, y ranges from 18 to 47, and z ranges from 40 to 60, with the proviso that x+y+z=100. x, y, and z indicate atomic percentage. The rhombohedral crystal structure of the main alloy includes a magnetic Co—Pt alloy region and a nonmagnetic Cu—Pt alloy region having a size ranging from 0.5 nm to 5 nm such that the nonmagnetic Cu—Pt alloy region provides a nanometer-scale pinning effect for the magnetic material.

Preferably, x ranges from 15 to 32, y ranges from 18 to 35, and z ranges from 48 to 52. More preferably, x ranges from 17 to 32 and y ranges from 18 to 33, and most preferably, x ranges from 23 to 26 and y ranges from 24 to 27.

Preferably, the rhombohedral crystal structure of the main alloy has a preferred orientation of the (111) plane.

It should be noted that, because the CoCuPt alloy having the rhombohedral crystal structure is unstable, preparation thereof requires specific manufacturing conditions. For example, the magnetic material of this invention is formed on a crystal substrate having a close-packed crystal structure. The close-packed crystal substrate may be made from a single crystal material or a polycrystal material that has a face centered cubic (fcc) crystal structure or a hexagonal close-packed (hcp) crystal structure. Specifically, when a fcc substrate made from a single crystal material is used, the (111) plane of the fcc substrate is perpendicular to the growth direction of the magnetic material; and when a hcp substrate made from a single crystal material is used, the (0001) plane of the hcp substrate is perpendicular to the growth direction of the magnetic material. In the examples of this invention, a MgO(111) substrate is used.

The main alloy of the magnetic material of this invention is prepared based on the concept of spinodal decomposition. The Co, Cu, and Pt atoms in the main alloy are in a state without thermodynamic barrier such that the atoms may diffuse in the rhombohedral lattice of the main alloy and occupy the lattice point. By controlling the specific manufacturing conditions, the Cu atoms are allowed to replace the Co atoms at the lattice point of the Co—Pt alloy region so as to form the nonmagnetic Cu—Pt alloy region, i.e., phase separation. Since the magnetic Co—Pt alloy region is uniformly distributed in the main alloy and the nonmagnetic Cu—Pt alloy region is disposed among the magnetic Co—Pt alloy region, a plurality of magnetic and nonmagnetic domains are uniformly formed in the main alloy, thereby resulting in a pinning effect on the magnetic domain walls and an improvement to the out-of-plane coercivity (Hc$\perp$) of the magnetic material.

Preferably, the magnetic and nonmagnetic domains of the main alloy have a domain size ranging from 80 nm to 120 nm, and thus, the pinning effect is on the nanometer-scale. Moreover, the rhombohedral lattice of the main alloy of the magnetic material of this invention has a preferred orientation of the (111) plane.

Examples 1 to 10

The main alloy of this invention was deposited on a MgO (111) substrate in the form of a thin film using a rotational dc magnetron sputtering system. The MgO(111) substrate was preheated at 650° C. for 1 hour in order to reconstruct and clean the surface thereof, followed by decreasing the temperature of the MgO(111) substrate to 350° C. and maintaining the substrate at 350° C. for 10 minutes. A CoCuPt alloy film was co-sputtered on the MgO(111) substrate using Co, Cu, and Pt targets. The working pressure for the sputtering process was 10 mTorr and the rotation rate of a platform upon which the MgO(111) substrate was disposed was 10 rpm. The composition of the thin film of the main alloy was controlled by adjusting the sputtering output power of the Co, Cu, and Pt targets and was determined by energy dispersion spectroscopy (EDS). The thickness of the thin film was controlled by the sputtering output power of the targets and the sputtering time.

The sputtering output power of the Co, Cu, and Pt targets, the thickness of the thin film composed of the main alloy, and the composition of the main alloy for each of Examples 1 to 10 are shown in Table 1.

Comparative Examples 1-4

The preparation for each of Comparative Examples (CE) 1 to 4 was the same as that for Examples 1 to 10, except that the Cu target was not used for CE1 and CE2, and that the sputtering output powers of the Co and Cu targets in CE3 and CE4 were different.

The sputtering output power of the Co, Cu, and Pt targets, the thickness of the thin film composed of the main alloy, and the composition of the main alloy for each of CE1 to CE4 are shown in Table 1.

TABLE 1

| Example/ | Sputtering Power (W) | | | Composition | Thickness |
|---|---|---|---|---|---|
| CE | Co | Cu | Pt | (at %) | (nm) |
| CE1 | 18 | 0 | 12 | $Co_{50}Pt_{50}$ | 20 |
| CE2 | | | | | 50 |
| E1 | 18 | 12 | 12 | $Co_{47}Cu_3Pt_{50}$ | 20 |
| E2 | 17 | 16 | 12 | $Co_{44}Cu_6Pt_{50}$ | 20 |
| E3 | 16 | 18 | 12 | $Co_{40}Cu_{10}Pt_{50}$ | 20 |
| E4 | 15 | 23 | 12 | $Co_{33}Cu_{17}Pt_{50}$ | 20 |
| E5 | 14 | 25 | 12 | $Co_{30}Cu_{20}Pt_{50}$ | 20 |
| E6 | 13 | 26 | 12 | $Co_{27}Cu_{23}Pt_{50}$ | 20 |
| E7 | | | | | 50 |
| E8 | 11 | 27 | 12 | $Co_{24}Cu_{26}Pt_{50}$ | 20 |
| E9 | | | | | 50 |
| E10 | 9 | 32 | 12 | $Co_{18}Cu_{32}Pt_{50}$ | 20 |
| CE3 | 9 | 34 | 12 | $Co_{16}Cu_{34}Pt_{50}$ | 50 |
| CE4 | 8 | 36 | 12 | $Co_{13}Cu_{37}Pt_{50}$ | 20 |

Transmission Electron Microscope (TEM) Analysis

Figure 2:
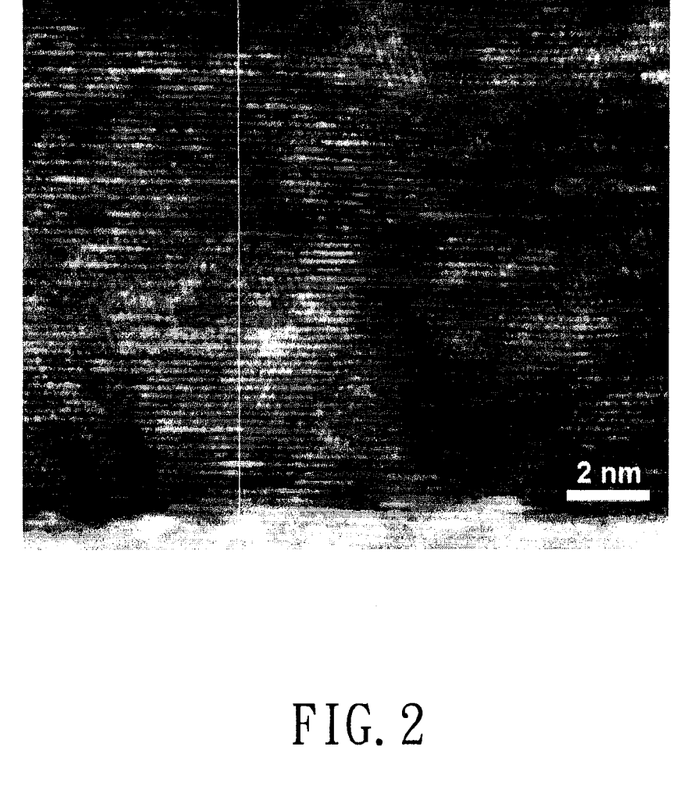
FIG. 2 is a cross-sectional transmission electron microscope image of the $Co_{50}Pt_{70}$ alloy of Comparative Example 1 of this invention.
Figure 3:
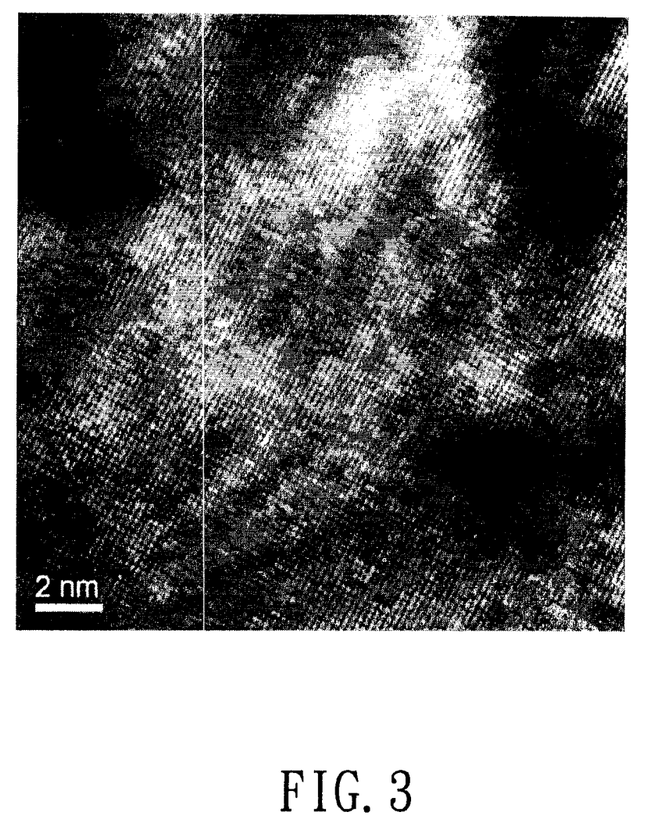
FIG. 3 is a top transmission electron microscope image showing the morphology of the $Co_{27}Cu_{23}Pt_{50}$ alloy of Example 6 of this invention.
Figure 4:
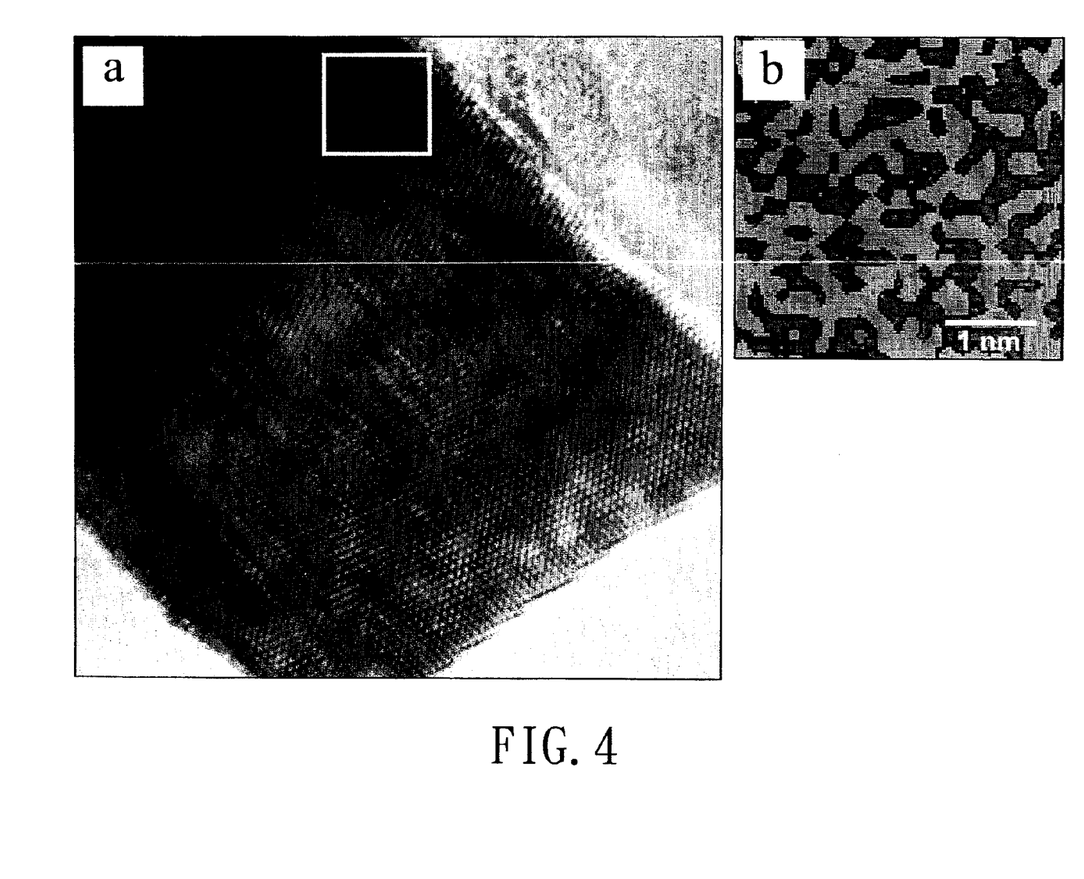
FIG. 4 is a cross-sectional transmission electron microscope image of the $Co_{27}Cu_{23}Pt_{50}$ alloy shown in FIG. 3.

Referring to FIG. 2, the cross-sectional TEM image of Comparative Example 1 shows the existence of concentrated planar defects such as twins, stacking faults and high-angle grain boundaries in the $Co_{50}Pt_{50}$ alloy thereof. The planar defects are unfavorable for the formation of the preferred orientation of the (111) plane in the rhombohedral crystal structure of the alloy. Referring to FIG. 3, the top TEM image of the $Co_{27}Cu_{23}Pt_{50}$ alloy of Example 6 shows no grain boundary and no precipitate, which indicate that the $Co_{27}Cu_{23}Pt_{50}$ alloy has a coherent lattice structure. In addition, the cross-sectional TEM image of Example 6 as shown in FIG. 4a shows that there exists only a few stacking faults. Therefore, the preferred orientation of the (111) plane is easier to be formed in the $Co_{27}Cu_{23}Pt_{50}$ alloy, resulting in a decrease in the rhombohedral lattice spacing along the [111] direction. FIG. 4b shows the element mapping of a square area shown in FIG. 4a. The element mapping was obtained using a scanning TEM (STEM) with a resolution of 128×128 pixels and a scanning time of 20 seconds. In FIG. 4b, the magnetic Co—Pt alloy region (black area) is shown to be uniformly distributed among the nonmagnetic Cu—Pt alloy region (grey area), and the nonmagnetic Cu—Pt alloy region is shown to have a size ranging from 0.5 nm to 5 nm.

Magnetic Force Microscopy (MFM) Analysis

Figure 5:
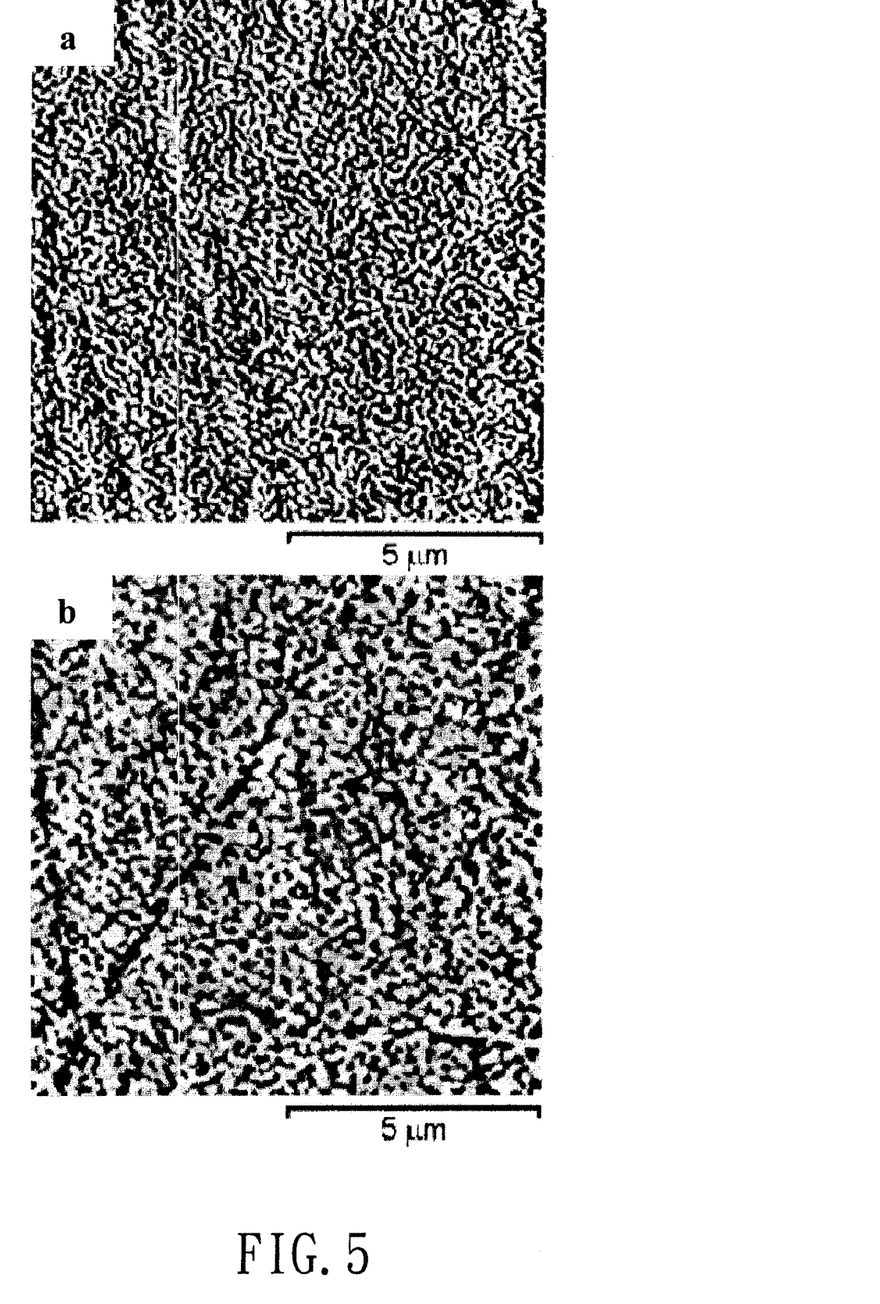
FIGS. 5a and 5b are magnetic force microscopy images of the $Co_{27}Cu_{23}Pt_{50}$ alloys of Examples 6 and 7 of this invention.

Referring to FIGS. 5a and 5b, the MFM images of Examples 6 and 7 indicate that the magnetic and nonmagnetic domains in the $Co_{27}Cu_{23}Pt_{50}$ alloy have a domain size of about 100 nm. The domain size herein refers to the width of the domains shown in the MFM image. In addition, the domains of the $Co_{27}Cu_{23}Pt_{50}$ alloy have a particulate-like pattern which resulted from and thus verifies the nanometer-scale pinning effect on the domain walls.

Figure 6:
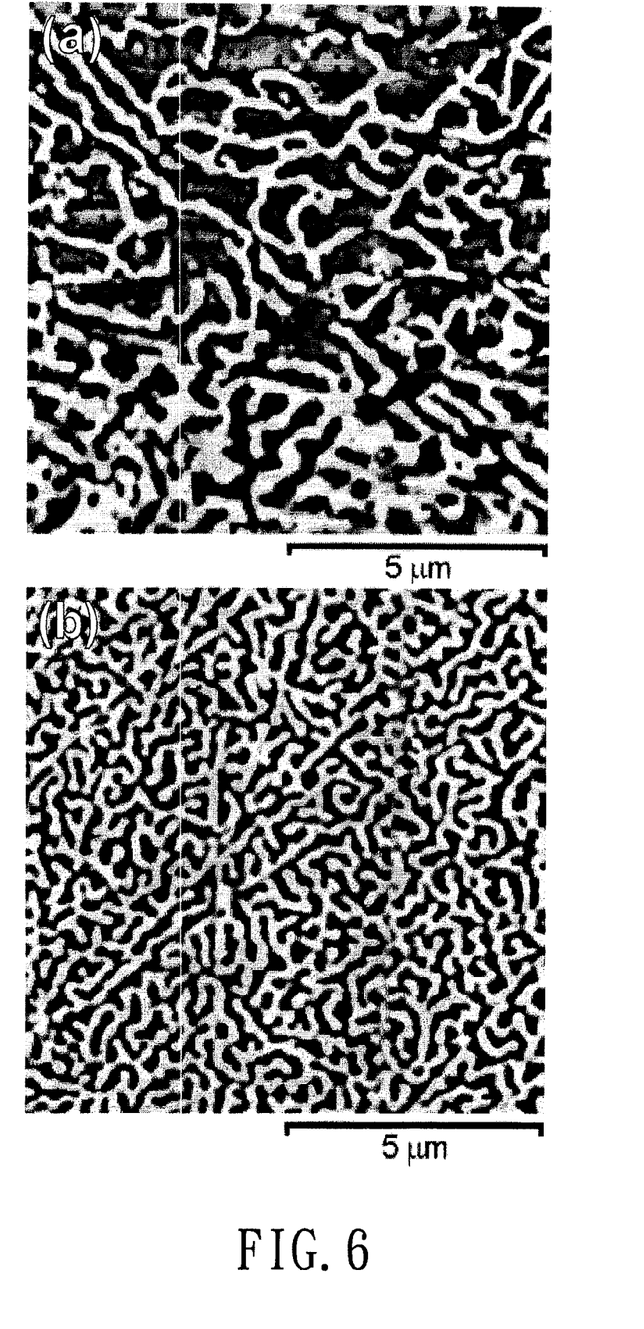
FIGS. 6a and 6b are magnetic force microscopy images of the $Co_{50}Pt_{70}$ alloys of Comparative Examples 1 and 2 of this invention.

FIGS. 6a and 6b show the MFM images of the $Co_{50}Pt_{50}$ alloy of Comparative Examples 1 and 2. The magnetic domains in the $Co_{50}Pt_{50}$ alloy have a domain size of about 200 nm to 500 nm and a maze-like domain pattern, which indicate the deficiency of the nanometer-scale pinning effect on the domain walls.

X-Ray Diffraction (XRD) Analysis

Figure 7:
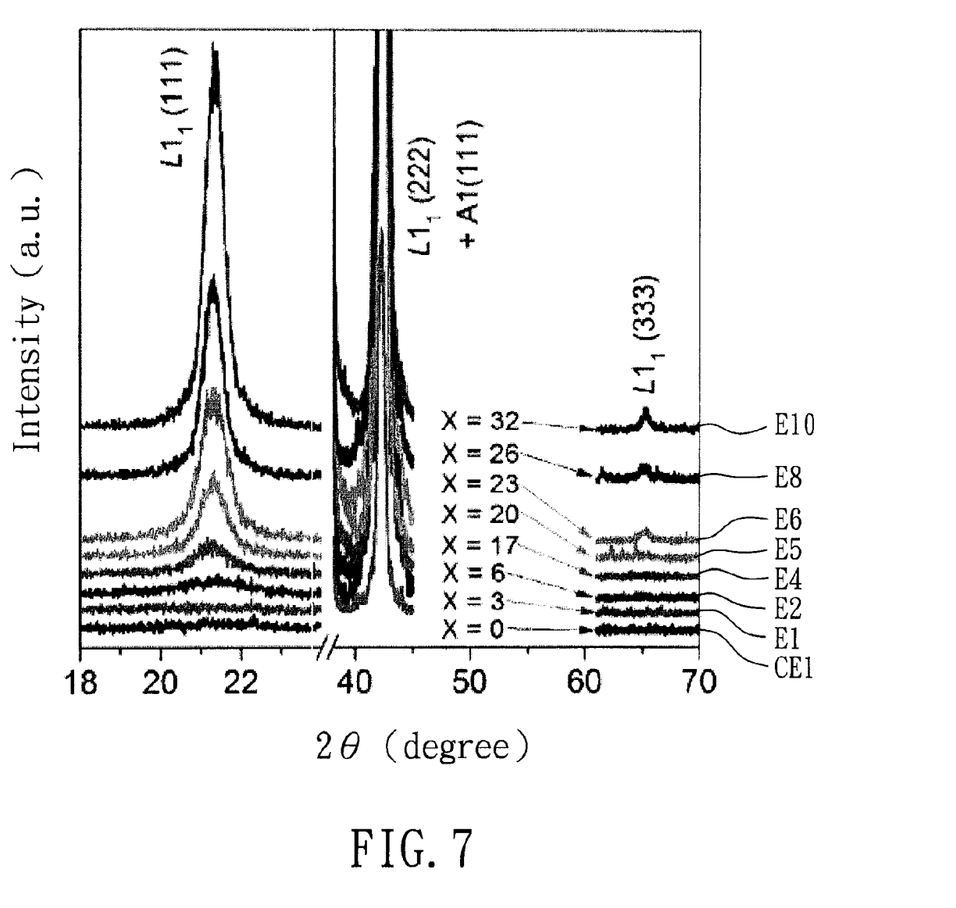
FIG. 7 is an X-Ray Diffraction (XRD) plot to illustrate the crystal structure of the main alloys of the examples of this invention and the alloy of comparative example 1.

The XRD curves shown in FIG. 7 illustrate the difference in the crystal structure of the $Co_{50}Pt_{50}$ alloy of Comparative Example 1 and the CoCuPt alloys of the examples. The XRD curves were compared with No. 42-1326 of JCPDF card. The data reveals that, as the concentration of Cu in the main alloy increases, the intensity of the diffraction peak of $L1_1(111)$ found at 2θ of about 21 degrees of the XRD curves increases, which demonstrates that the Co—Cu—Pt alloy has a rhombohedral crystal structure and a preferred orientation of the (111) plane. The rhombohedral crystal structure and the preferred orientation of the (111) plane are advantageous to the improvement in out-of-plane coercivity ($Hc_\perp$) and the reduction in in-plane coercivity ($Hc_\parallel$).

Figure 8:
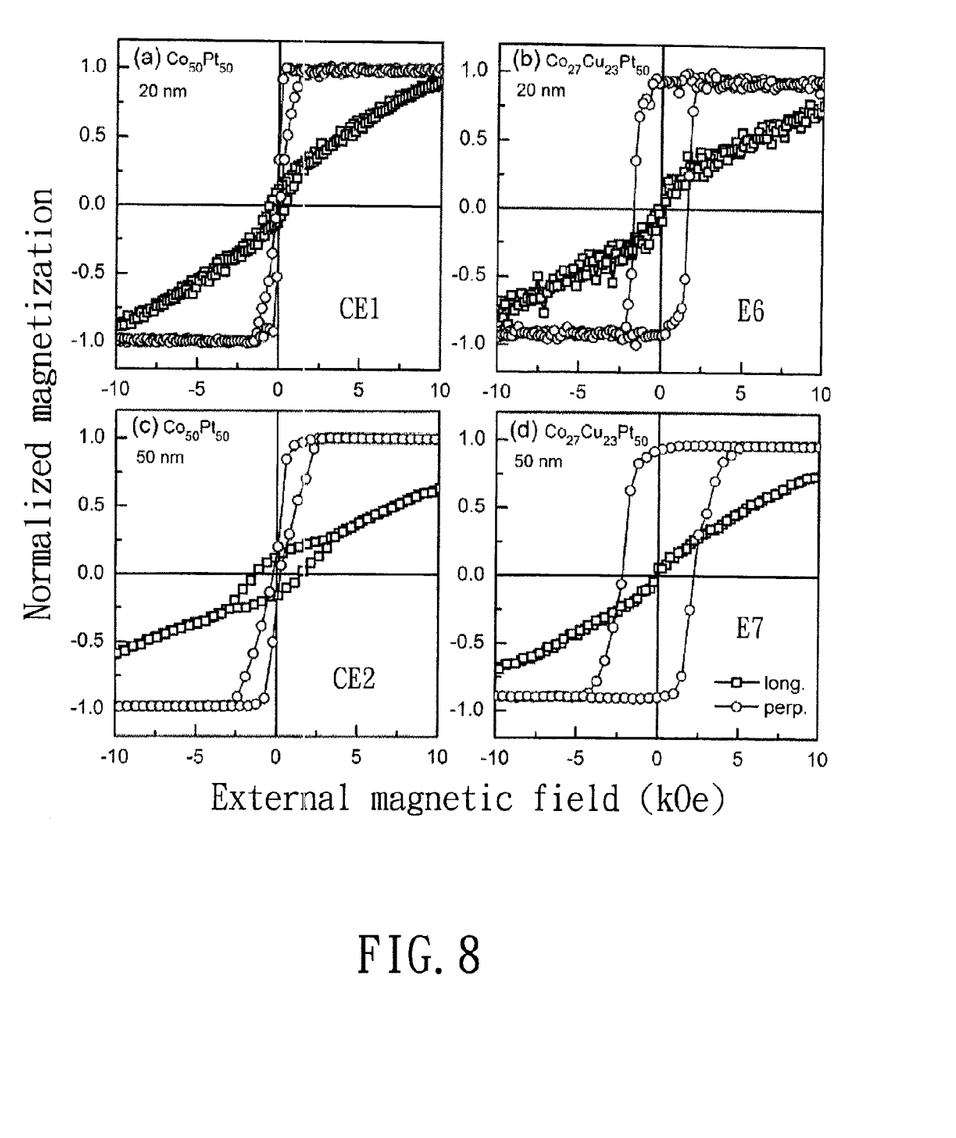
FIG. 8 illustrates hysteresis-loop plots for examples 6 and 7 of this invention and comparative examples 1 and 2.

Measurement of Coercivity ($H_C$), Saturation Magnetization ($M_s$), and Hysteresis-Loop Referring to FIG. 8, for Examples 6 and 7, the room temperature anisotropy field ($H_k^{RT}$) is about 20 kOe measured by the intersection of the perpendicular and the longitudinal hysteresis loops. For Comparative Examples 1 and 2, the room temperature anisotropy field ($H_k^{RT}$) is also about 20 kOe measured from extrapolation of the hysteresis loops. The extrapolation method is a general technique known to those skilled in the art and a description thereof is omitted herein for brevity.

The out-of-plane coercivity ($H_c\perp$), in-plane coercivity ($H_c\parallel$), and saturation magnetization ($M_s$) for each of Examples 1 to 10 and Comparative Examples 1 to 4 are shown in Table 2.

TABLE 2

| Example/CE | $H_c\perp$ (kOe) | $H_c\parallel$ (kOe) | $M_s$ (emu/cm³) |
| --- | --- | --- | --- |
| CE1 | 0.12 | 0.49 | 733 |
| CE2 | 0.23 | 1.40 | 739 |
| E1 | 0.42 | 0.29 | 651 |
| E2 | 0.45 | 0.35 | 604 |
| E3 | 0.52 | 0.30 | 598 |
| E4 | 0.91 | 0.11 | 542 |
| E5 | 1.05 | 0.10 | 507 |
| E6 | 1.70 | 0.07 | 492 |
| E7 | 2.20 | 0.07 | 498 |
| E8 | 1.90 | 0.14 | 494 |
| E9 | 2.06 | 0.12 | 484 |
| E10 | 1.05 | 0.05 | 408 |
| CE3 | 0.50 | 0.30 | 406 |
| CE4 | 0.06 | 0.06 | 310 |

Comparing the examples with the same atomic ratio in the composition but different thicknesses (20 and 50 nm), i.e., E6-E7, and E8-E9, the data reveal that $H_c\perp$ is slightly increased and $H_c\parallel$ is slightly decreased in E7 and E9 with 50 nm thickness. Meanwhile, the data of $H_c\perp$, and $M_c\parallel$, $M_s$ are superior over those of CE1 and CE2, which confirm the validity of nano-scale pinning effect of the CoCuPt alloy of this invention in a wide range of thickness.

For CE1 and CE2, which contain no Cu, the saturation magnetization ($M_s$) thereof are close to the value of CoPt disorder phase (A1). As the concentration of Cu increased, although the $M_s$ in the examples of this invention is decreased, which demonstrates simple magnetic dilution effect that corresponds to the aforementioned phase separation of the CoCuPt alloy, the $M_s$ value thereof is still higher than that of a general magnetic recording medium. Thus, the magnetic material of this invention may conform to commercial requirements. Referring to CE3 and CE4, when the mole ratio of Cu is higher than 32% and the mole ratio of Cu is lower than 18%, $H_c\perp$ and $M_s$ of the CoCuPt alloy are both drastically decreased.

As shown in Table 2 and FIG. 8, the CoCuPt alloy of the magnetic material of each of Examples 6 and 7 has superior out-of-plane coercivity ($H_c\perp$) over that of each of Comparative Examples 1 and 2, but the room temperature anisotropy field ($H_k^{RT}$) between Examples 6-7 and Comparative Examples 1-2 has no significant difference, which might be attributed to extra resistance that is provided to the domain wall motion of the magnetic Co—Pt phase domains and that is caused by the isolation of the magnetic Co—Pt alloy domains. The isolation of the magnetic Co—Pt alloy domains resulted from the existence of the nonmagnetic Cu—Pt alloy domains. The aforesaid results prove that the CoCuPt alloy of this invention has superior perpendicular magnetocrystalline anisotropy.

In addition, as shown in Table 2, the CoCuPt alloys of Examples 4 to 8 of this invention have an out-of-plane coercivity ($H_c\perp$) greater than 0.8 kOe and are suitable for applying to a patterned medium. Moreover, the CoCuPt alloys of Examples 1-4, 6, 8 and 10 have an out-of-plane coercivity ($H_c\perp$) smaller than 2.0 kOe and are suitable for a spintronic device.

In conclusion, since the magnetic material of this invention includes a main alloy that has nanometer-scale nonmagnetic and magnetic alloy regions which result in nanometer-scale pinning effect, the out-of-plane coercivity of the magnetic material is improved. Moreover, the main alloy of the magnetic material has a preferred orientation of the (111) plane of the rhombohedral crystal structure and could be applied to a patterned medium or a spintronic device.

While the present invention has been described in connection with what are considered the most practical and preferred embodiments, it is understood that this invention is not limited to the disclosed embodiments but is intended to cover various arrangements included within the spirit and scope of the broadest interpretations and equivalent arrangements.

What is claimed is:

1. A magnetic material comprising an alloy having a rhombohedral crystal structure and a composition represented by $Co_yCu_xPt_z$, wherein x ranges from 23 to 26, y ranges from 18 to 47, and z ranges from 40 to 60, with the proviso that x+y+z=100, said rhombohedral crystal structure of said alloy including a magnetic Co—Pt alloy region and a nonmagnetic Cu—Pt alloy region.

2. The magnetic material of claim 1, wherein said nonmagnetic Cu—Pt alloy region of said rhombohedral crystal structure has a size ranging from 0.5 nm to 5 nm.

3. The magnetic material of claim 1, wherein y ranges from 18 to 35 and z ranges from 48 to 52.

4. The magnetic material of claim 3, wherein y ranges from 18 to 33.

5. The magnetic material of claim 4, wherein y ranges from 24 to 27.

6. The magnetic material of claim 1, wherein said rhombohedral crystal structure of said alloy has a preferred orientation of the (111) plane.

* * * * *